United States Patent [19]

Kohyama

[11] 4,181,865
[45] Jan. 1, 1980

[54] SENSING CIRCUIT FOR A MULTI-LEVEL SIGNAL CHARGE

[75] Inventor: Susumu Kohyama, Kawasaki, Japan

[73] Assignee: Tokyo Shibaura Electric Co., Ltd., Japan

[21] Appl. No.: 900,860

[22] Filed: Apr. 28, 1978

[30] Foreign Application Priority Data

Apr. 28, 1977 [JP] Japan .................... 52-49719

[51] Int. Cl.$^2$ .................... H03K 5/20; G11C 7/06; G11C 19/28; H03K 3/286
[52] U.S. Cl. .................... 307/361; 307/221 D; 307/279; 307/360; 307/DIG. 3; 365/205; 365/208
[58] Field of Search .............. 307/352, 353, 355, 362, 307/360, 361, 221 D, DIG. 3, 279; 357/24; 365/75, 183, 205, 207, 208, 222

[56] References Cited

U.S. PATENT DOCUMENTS

| | | | |
|---|---|---|---|
| 3,760,381 | 9/1973 | Yao | 307/DIG. 3 X |
| 3,955,101 | 5/1976 | Amelio et al. | 307/221 D X |
| 3,979,603 | 9/1976 | Gosney | 307/221 D |
| 3,983,413 | 9/1976 | Gunsagar et al. | 307/DIG. 3 X |
| 3,986,172 | 10/1976 | Elmer et al. | 307/DIG. 3 X |
| 4,024,512 | 5/1977 | Amelio et al. | 307/DIG. 3 X |
| 4,025,907 | 5/1977 | Karp et al. | 307/DIG. 3 X |
| 4,085,459 | 4/1978 | Hirabayashi | 307/221 D X |
| 4,136,292 | 1/1979 | Suzuki et al. | 307/355 |

OTHER PUBLICATIONS

Aaron, *IBM Tech. Discl. Bull.*, vol. 19, No. 5, pp. 1768–1769, 10/1976.
Bernadotte et al., *IBM Tech. Discl. Bull.*, vol. 18, No. 8, p. 2540, 1/1976.

*Primary Examiner*—Larry N. Anagnos
*Attorney, Agent, or Firm*—Finnegan, Henderson, Farabow & Garrett

[57] ABSTRACT

This multi-level signal charge sensing circuit includes a first capacitor for holding inspected charge, a second capacitor for holding a plurality of reference charge levels and a comparator for comparing potentials produced at the first and second capacitors. As the plurality of reference charge levels, (N−1) charge levels of different known values are prepared. The inspected charge is given to the first capacitor which is reset, and the (N−1) reference charge levels are successively given from the highest or lowest level to the second capacitor which is also reset. The comparator is operated for every step of supplying each reference charge level. Of the successive reference charge supplying steps at an instant between the steps corresponding to 0 and (N−1), the output state of the comparator is inverted, thus supplying digital information representing the inspected charge level. This sensing circuit permits discrimination and sensing or detection of N different inspected charge levels with a single circuit construction.

19 Claims, 42 Drawing Figures

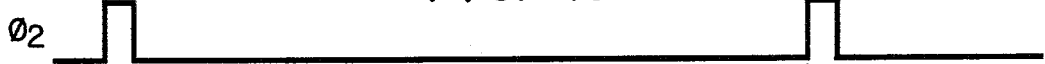
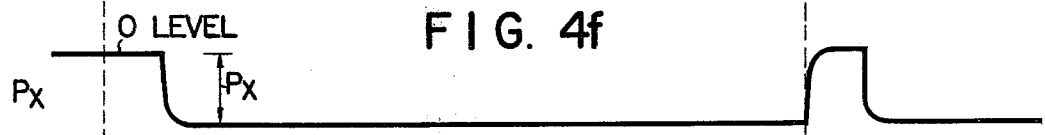
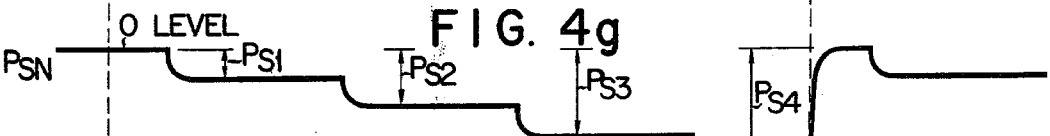
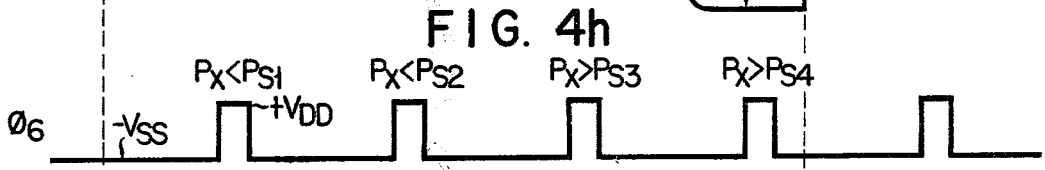
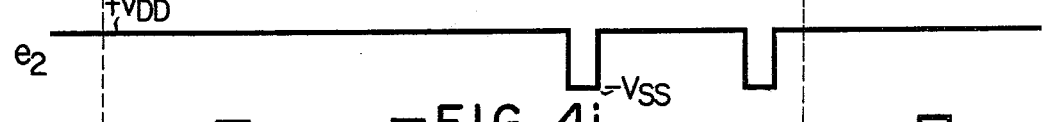
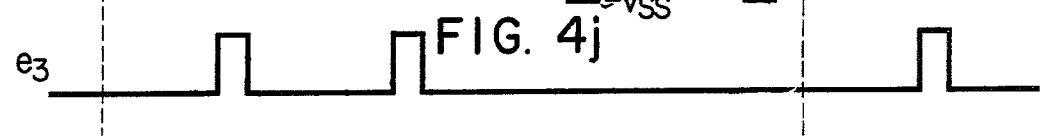

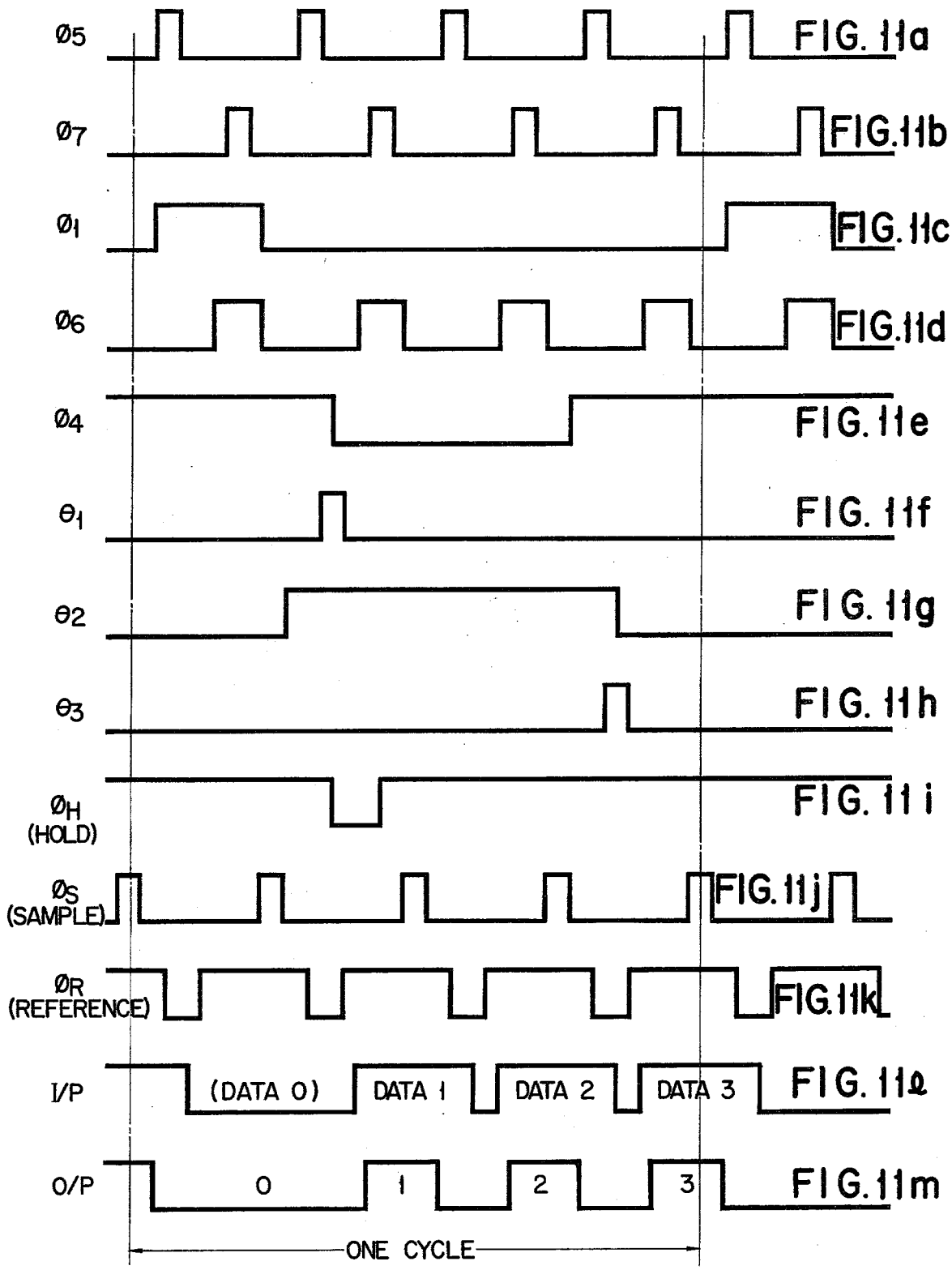

SENSING CIRCUIT FOR A MULTI-LEVEL SIGNAL CHARGE

BACKGROUND OF THE INVENTION

This invention relates to sensing circuits for sensing charge levels of multi-level signal charges such as those employed in charge transfer devices or the like.

Charge coupled devices (CCD), bucket bridge devices (BBD) and like charge transfer devices (CTD) inherently function as analog shift registers capable of storing and transferring signal charges which are analog quantities. When using the CTD for a digital system, it has been a usual practice to store and transfer of two-level signal charges. More particularly, when using the CTD for a digital shift register use has been made of only two states, namely one where the potential well of the CTD is filled with charge and the other where the potential well is empty. Since the CTD naturally functions to handle analog signals, it is of course possible for the CTD to store a multi-level signal having more than two levels. In practice, however, various limitations are imposed upon charge transfer characteristics, and also lack of circuit techniques effective for use in multi-level signal charge sensing circuits and recirculating shift registers has presented obstacles to the realization of a multi-level signal memory system utilizing analog shift registers.

Hitherto, sensing circuits for sensing the charge levels of a multi-level signal charge have employed (N−1) or more sensing circuits arranged in parallel for a plurality of N signal potentials. This circuit construction, however, not only requires a number of sensing circuits but also requires the provision of an exclusive reference potential for sensing each of the N signal potentials for each of the sensing circuits. In addition, with the above construction a number of refreshing data lines are required for circulating and memorizing the multi-level signal dealt with, or in the case of effecting recirculating memorization of a single refreshing data line, parallel-to-series and series-to-parallel conversion circuits are required. The parallel-to-series and series-to-parallel conversion circuits have the function of converting the multi-level data for circulation into a data format having a time series in order to circulate the data through the single refreshing data line and of restoring the data to the initial multi-level data signal after the circulation. In view of these factors, the prior art circuit construction used for such sensing circuits is complicated and it is very difficult to reduce the integration density when fabricating such circuits in semiconductor integrated circuit structure.

SUMMARY OF THE INVENTION

An object of the invention is to provide a multi-level signal charge sensing circuit, which permits sensing of a signal charge having a number of charge levels with a single circuit construction.

To achieve the above object, the invention provides a multi-level signal charge sensing circuit, which comprises a means for holding an inspected charge, a means for successively supplying a plurality of reference potentials of different levels from the highest or lowest level, and a comparator means for comparing an unknown potential corresponding to the inspected charge level present at the inspected charge holding means holding the inspected charge supplied thereto with each of the plurality of reference potentials led out from the reference potential supply means, thereby to provide, at the instant of inversion of the relation between magnitudes of the unknown potential and each of the known reference potentials being compared, a signal based upon the inversion.

With the above construction, it is possible to obtain important effects. Namely, the inspected charge having a level corresponding to one of N different potentials, for instance, is compared by a comparator means with (N−1) reference potentials (known), that is, potential of levels from 1 to (N−1) on a time-sequential basis. From the results of the comparison, one of N levels, namely from 0 to (N−1), will be determined to be in correspondence with the level of the inspected charge whereby information representing the level of the inspected charge is obtained.

BRIEF DESCRIPTION OF THE DRAWINGS

FIGS. 4a to 4j collectively represent a timing chart illustrating the operation of the circuit shown in FIG. 3;

FIGS. 11a to 11m collectively represent a timing chart illustrating the operation of the circuit shown in FIG. 10.

DESCRIPTION OF THE PREFERRED EMBODIMENTS

Figure 1:
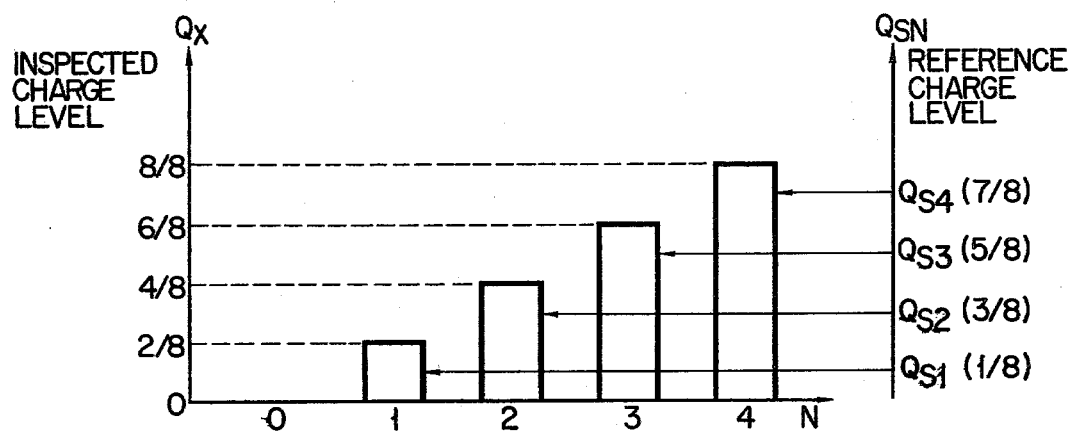
FIG. 1 is the graph showing a relation between the inspected charge level and a reference charge level for each of N, e.g., five as shown, levels of the inspected charge.

The invention will now be described in conjunction with preferred embodiments thereof with reference to FIGS. 1 to 13. Throughout the figures like parts are designated by like reference numerals for the sake of simplicity.

FIG. 1 shows a graph representing the relation between the inspected charge level $Q_x$ and reference charge levels $Q_{SN}$ for each of N, e.g., five as shown, values of the inspected charge. N=0 is made to correspond to inspected charge level $Q_x=0$, and N=4 is made to correspond to inspected charge level $Q_x=1$. In this case, N=1, 2 and 3 respectively correspond to $Q_x=2/8$, $4/8$ and $6/8$. Of these five levels of the charge $Q_x$, reference charge levels $Q_{SN}$ are prepared for at least four levels respectively. The level of each charge $Q_{SN}$ is set to a level intermediate between N and (N−1) in order to avoid malfunction of the sensing circuit due to slight variations of the inspected charge $Q_x$ from the fixed level. More particularly, the individual charge levels $Q_{SN}$ are preset to $Q_{S1}=\frac{1}{8}$, $Q_{S2}=3/8$, $Q_{S3}=\frac{5}{8}$ and $Q_{S4}=\frac{7}{8}$ for N=1, 2, 3 and 4 respectively. Since in this case N=0 corresponds to $Q_x=0$, great transfer loss results particularly where of surface channel CCDs are employed. Therefore, sensing of N=0 sometimes becomes impossible due to deterioration caused by the transfer of the inspected charge. In such a case, it is impossible to distinguish between the case when N=0 is sensed due to the fact that the inspected charge $Q_x$ is not transferred to the sensing circuit and the case when N=0 due to the fact that the inspected charge $Q_x$ corresponding to $Q_x=0$ is transferred to the sensing circuit.

Figure 2:
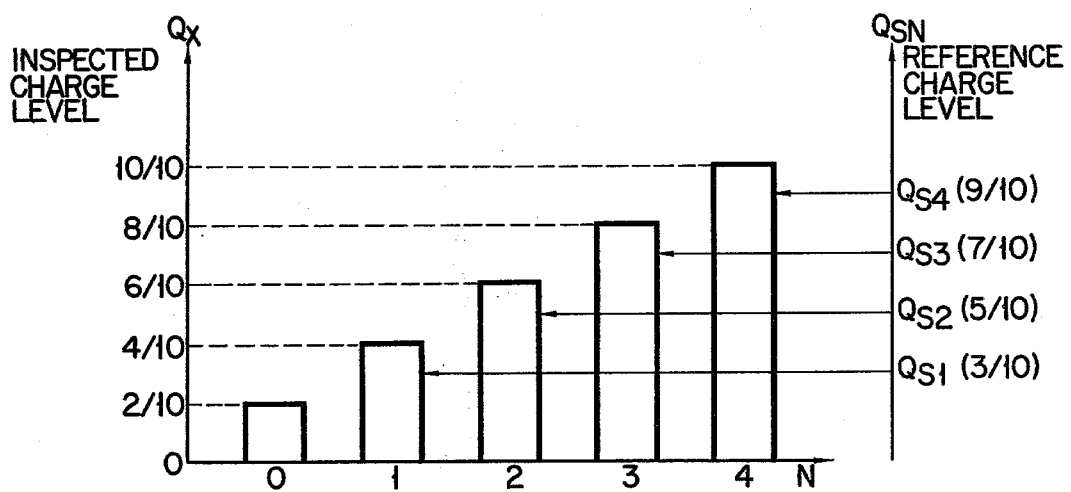
FIG. 2 is a graph similar to FIG. 1 but showing a similar relation in terms of the fat-zero technique.

FIG. 2 is a graph showing the case of a system for setting the inspected charge $Q_x$, which can eliminate the above drawbacks. Here, N=0 to 4 are made to correspond to $Q_x=2/10$, 4/10, 6/10 8/10 and 10/10 respectively. and to these levels of $Q_x$, the respective levels 3/10, 5/10, 7/10 and 9/10 are made to correspond as the reference charge levels $Q_{SN}$. Here, sensing of N=0 occurs when the inspected charge level $Q_x$ does not correspond to any of the reference charge levels $Q_{S1}$ to $Q_{S4}$. In this example, the charge level $Q_x$ corresponding to N=0 is not zero but has a level of 2/10, so that the drawback mentioned earlier in connection with FIG. 1 is overcome. Further, since the smallest level $Q_{S1}$ is greater than that shown in FIG. 1, the noise margin in the case of sensing N=1 can be increased. This setting system is called the "fat-zero" technique. The sensing circuit according to FIG. 3 is applicable to either system of FIG. 1 or 2.

Figure 3:
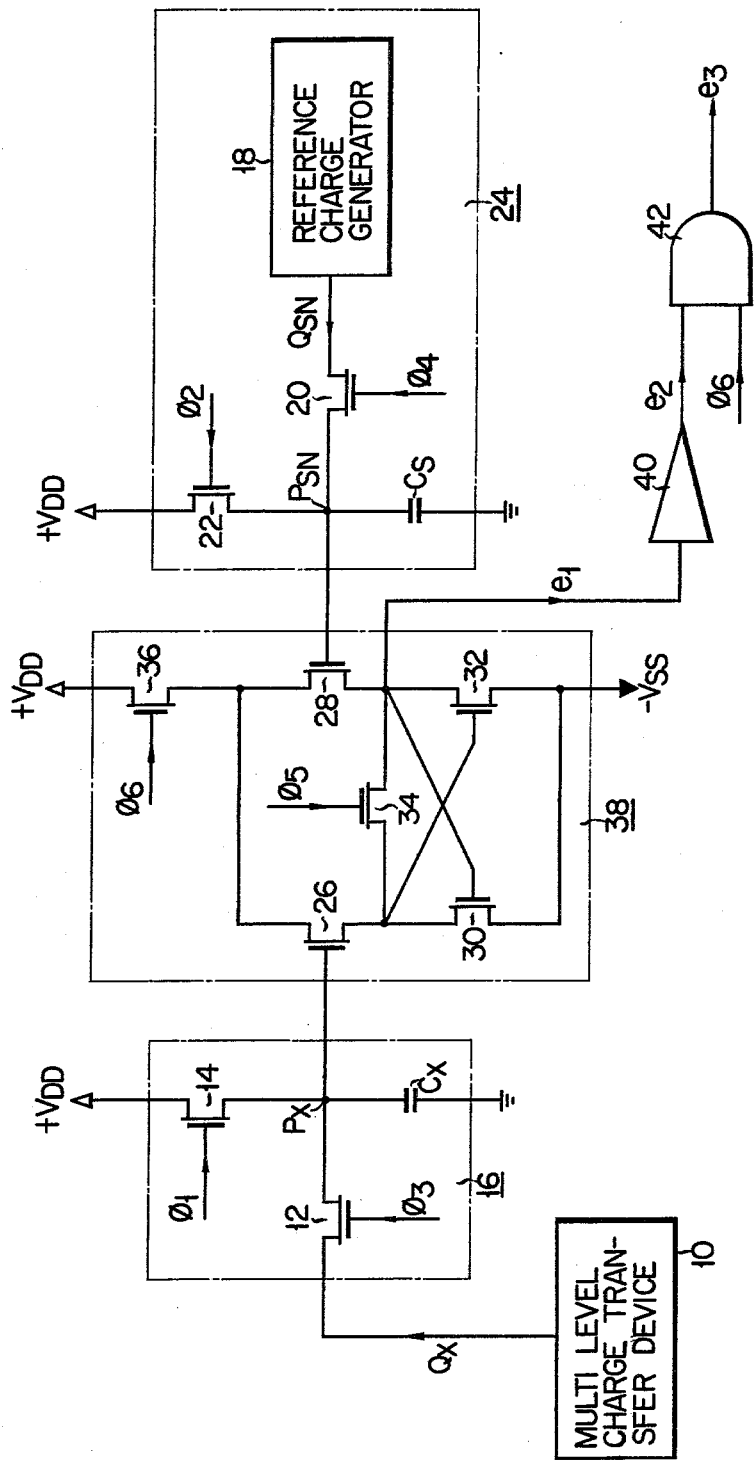
FIG. 3 is a schematic representation of a preferred embodiment of the sensing circuit according to the invention.

FIG. 3 shows a preferred embodiment of the sensing circuit. The inspected charge level $Q_x$, which is provided from a multi-level charge transfer device 10 such as a CCD circuit for storing and transferring multi-level signal charge, is supplied to a first gate transistor, that is, to the drain (source) of an N-channel MOS FET 12. A first hold capacitor $C_x$ for holding the level $Q_x$ of charge supplied thereto is connected between the source (drain) of the FET 12 and a grounding circuit. A second reset transistor, that is, an N-channel MOS FET 14, has its source (drain) connected to the junction $P_x$ between the source (drain) of FET 12 and capacitor $C_x$. The drain (source) of the FET 14 is connected to a circuit which has a positive potential $+V_{DD}$ as reset potential. The FETs 12 and 14 and capacitor $C_x$ constitute an inspected charge hold circuit 16. In the inspected charge hold circuit 16, a first gate signal $\phi_3$ and a first reset signal $\phi_1$ are supplied to the gates of the respective FETs 12 and 14.

Meanwhile, (N−1) reference charge levels $Q_{SN}$ successively produced from a reference charge generator 18 for determining the N level to which the inspected charge level $Q_x$ corresponds are supplied to a second gate transistor, that is, the drain (source) of an N-channel MOS FET 20. A second hold capacitor $C_S$ for holding the level $Q_{SN}$ of charge supplied thereto is connected between the source (drain) of the FET 20 and a grounding circuit. A second reset transistor, that is, an N-channel MOS FET 22, has its source (drain) connected to the junction $P_{SN}$ between the source (drain) of the FET 20 and a capacitor $C_S$. The drain (source) of the FET 22 is connected to a circuit which has a positive potential $+V_{DD}$ as reset potential. The FETs 20 and 22, capacitor $C_S$ and reference charge generator 18 constitute a reference potential supplying circuit 24. In the reference potential supplying circuit 24, a second gate signal $\phi_4$ and a second reset signal $\phi_2$ are supplied to the gates of the respective FETs 20 and 22.

A first transistor, that is, an N-channel MOS FET 26, has its gate connected to the junction point $P_x$, and a second transistor, that is, an N-channel MOS FET 28, has its gate connected to the junction point $P_{SN}$. The sources of the FETs 26 and 28 are connected to the drains of a third transistor, that is, an N-channel MOS FET 30, and a fourth transistor, that is, an N-channel MOS FET 32, respectively. The FETs 30 and 32 have their gates connected to the drains of the respective FETs 32 and 30 and their sources commonly connected to a circuit which has a first potential, that is, a negative potential $-V_{SS}$. A fifth transistor, that is, an N-channel MOS FET 34, has its drain and source connected between the drains of the FETs 30 and 32. Since the drain and source of the FET 34 are symmetrical with respect to the gate thereof, this transistor can be connected in a desired direction. The FETs 26 and 28 have their drains commonly connected to the source of a sixth transistor, that is, an N-channel MOS FET 36. The FET 36 has its drain connected to a circuit which has a second potential, that is, a positive potential $+V_{DD}$. Although the second potential and the aforementioned reset potential are made the same with each other here, they may be different from each other as well. A flip-flop amplifier circuit which is constituted by the FETs 26 and 36 form a comparator circuit 38. In this comparator circuit 38, a third reset signal $\phi_5$ and a third gate signal $\phi_6$ are supplied to the gates of the respective FETs 34 and 36.

The potential $P_x$ produced at the gate of the FET 26, that is, the level sense node, is proportional to the level $Q_x$ of charge supplied to the capacitor $C_X$, and the potential $P_{SN}$ produced at the gate of the FET 28, that is, the reference node, is proportional to the level $Q_{SN}$ of charge supplied to the capacitor $C_S$. The comparator means 38 compares the potentials at points $P_x$ and $P_{SN}$ and discriminates the case of $P_x>P_{SN}$ and the case of $P_x<P_{SN}$. A signal based upon this discrimination, that is, the comparison output signal $e_1$ of the comparator circuit 38, is obtained from the source of the FET 28 (or 26). This signal $e_1$ is passed through a buffer circuit 40 and coupled to an AND circuit 42 as a gate signal $e_2$. The AND gate circuit 42 also receives the third gate signal $\phi_6$ and produces an AND signal $e_3$ which represents the AND function of the signals $e_2$ and $\phi_6$.

As the reference charge generator 18 may be used, for instance, a small scale CCD (of $\frac{1}{2}$ to several bits). This CCD serves to receive a constant quantity of charge from a separate charge supply source and to transfer this charge as a reference charge, and the level of transferred charge is suitably set by the size of the cell constituting the CCD. As an alternative, it is possible to use a constant current source as the reference charge generator 18. In such case, the total reference charge level $Q_{SN}$ supplied in n comparison steps is $$Q_{SN}=n\int_0^{t_s} I_S dt = nI_S t_s$$

where $I_S$ is the current in the constant current source, and $t_s$ is the gate period of the second gate signal.

Further, the FETs 12 and 20 may be omitted so long as the aforementioned multi-level charge transfer device 10 and reference charge generator 18 are rendered into completely cut-off state after charge is supplied to the capacitors $C_X$ and $C_S$, that is, so long as counterflow of the supplied charge is not caused. In other words, whether or not the gate circuit consisting of the FETs 12 and 20 is employed is determined case by case.

Furthermore, the capacitors $C_X$ and $C_S$ may not be necessarily connected at their one end to the grounding circuit; for example, the capacitors $C_X$ and $C_S$ may be connected at their one end to a circuit having a negative potential $-V_{SS}$. In general, it is only necessary for the capacitors $C_X$ and $C_S$ to hold the supplied charge. Instead of the discrete capacitors $C_X$ and $C_S$ it is possible to utilize distributed capacitance, which may belong to the circuit but one end of which is not clearly connected to a definite part of the circuit.

FIGS. 4a to 4j represent a timing chart illustrating the operation of the sensing circuit shown in FIG. 3. Here, there are five N levels which may be assumed by the inspected charge, and in this example N=2 is sensed. At the instant of appearance of the first clock pulse, the first reset pulse $\phi_1$ and the second reset pulse $\phi_2$ are produced. At this time, the FETs 14 and 22 are triggered to charge the capacitors $C_X$ and $C_S$ up to the reset potential $+V_{DD}$. Then, at the instant of appearance of the second clock pulse the first gate pulse $\phi_3$, the second gate pulse $\phi_4$ and the third reset pulse $\phi_5$ are produced. At this time, the capacitor $C_X$ is charged to the sampled charge level $Q_x$ supplied through the FET 12 in the "on" state, and a potential $P_x$ is applied to the level sense node of the comparator circuit 38. Also, the first reference charge level $Q_{S1}$ supplied through the FET 20 in the "on" state charges the capacitor $C_s$, and a potential $P_{S1}$ is applied to the reference node $P_{SN}$. Further, the sources of the FETs 26 and 28 are short-circuited to each other by the FET 34 in the "on" state, thus reducing the potential difference between the sources of the FETs 26 and 28 practically to zero.

At the subsequent instant of appearance of the third clock pulse the third gate pulse $\phi_6$ is produced. At this time, the flip-flop amplifier circuit in the comparator circuit 38 is rendered into the operative state to compare the potentials $P_x$ and $P_{S1}$. Since at this time $P_x < P_{S1}$, the source potential on the FET 26 is lower than the source potential on the FET 28. Thus, the FET 32 is cut off by the operation of the flip-flop circuit formed by the FETs 30 and 32, whereby the source potential on the FET 28, that is, the potential of the comparison output signal $e_1$, becomes substantially $+V_{DD}$. This signal $e_1$ is passed through buffer circuit 40 and is applied as the gate signal $e_2$ of potential $+V_{DD}$ to AND gate circuit 42. Since at this time the third gate signal $\phi_6$ fed to the AND gate circuit 42 is of high level, that is, potential $+V_{DD}$, the AND signal $e_3$ becomes high level. This signal $e_3$ is held at high level during the presence of the pulse $\phi_6$ and becomes low level upon termination of the pulse $\phi_6$.

At the subsequent instant of appearance of the fifth clock pulse, the second gate signal $\phi_4$ and the third reset signal $\phi_5$ are again produced. At this time, the capacitor $C_x$ is not reset, so that the potential $P_x$ is not changed. On the other hand, the capacitor $C_s$ is further charged by the second reference charge level $Q_{S2}$ and a potential $P_{S2}$ is applied to the reference node. At this time, the potential difference between the sources of the FETs 26 and 28 is simultaneously reduced to zero. At the subsequent instant of appearance of the sixth clock pulse, the potentials $P_x$ and $P_{S2}$ are compared in the manner described earlier. Since at this time $P_x < P_{S2}$, the signal $e_3$ is at an high level as in the previous case.

At the instant of appearance of the eighth clock pulse, a potential $P_{S3}$ is generated. Then, at the instant of appearance of the ninth clock pulse the potentials $P_x$ and $P_{S3}$ are compared with each other. Since at this time $P_x > P_{S3}$, the signal $e_3$ remains at the low level indicating that an inversion has occurred in the comparison result. means that at this instant the comparison circuit 38 has made a determination of the N level which corresponds to the inspected charge level $Q_x$.

Likewise, at the subsequent instant of appearance of the eleventh clock pulse a potential $P_{S4}$ is generated, and the comparison of the potentials $P_x$ and $P_{S4}$ is executed at the instant of appearance of the twelfth clock pulse. Since at this time $P_x > P_{S4}$, the signal $e_3$ remains at the low level.

It will be understand that in the example illustrated in FIGS. 4a to 4j the sensing of the N level corresponding to the inspected charge level $Q_x$ is completed within one sensing cycle or within the period of 12 clock pulses. Although the above example of FIGS. 4a to 4j concerns the case of N=2, similar sensings can be obtained for any of the five levels of N, namely N=0 to 4. In any case, no pulse is produced as the signal $e_3$ during a sensing cycle so long as $P_x > P_{S1}$. On the other hand, four $E_3$ pulses are produced as the signal $e_3$ during a sensing cycle when $P_x < P_{S4}$. Generally, in the circuit construction of FIG. 3, the signal $e_3$ that is produced during one sensing cycle contains n pulses in the case when $P_{Sn} < P_x < P_{S(n+1)}$ ($0 \leq n \leq N$). In other words, when the pulses of the signal $e_3$ are counted within one sensing cycle, the resultant count directly represents the value of the inspected (sampled) charge level $Q_x$.

Figure 5:
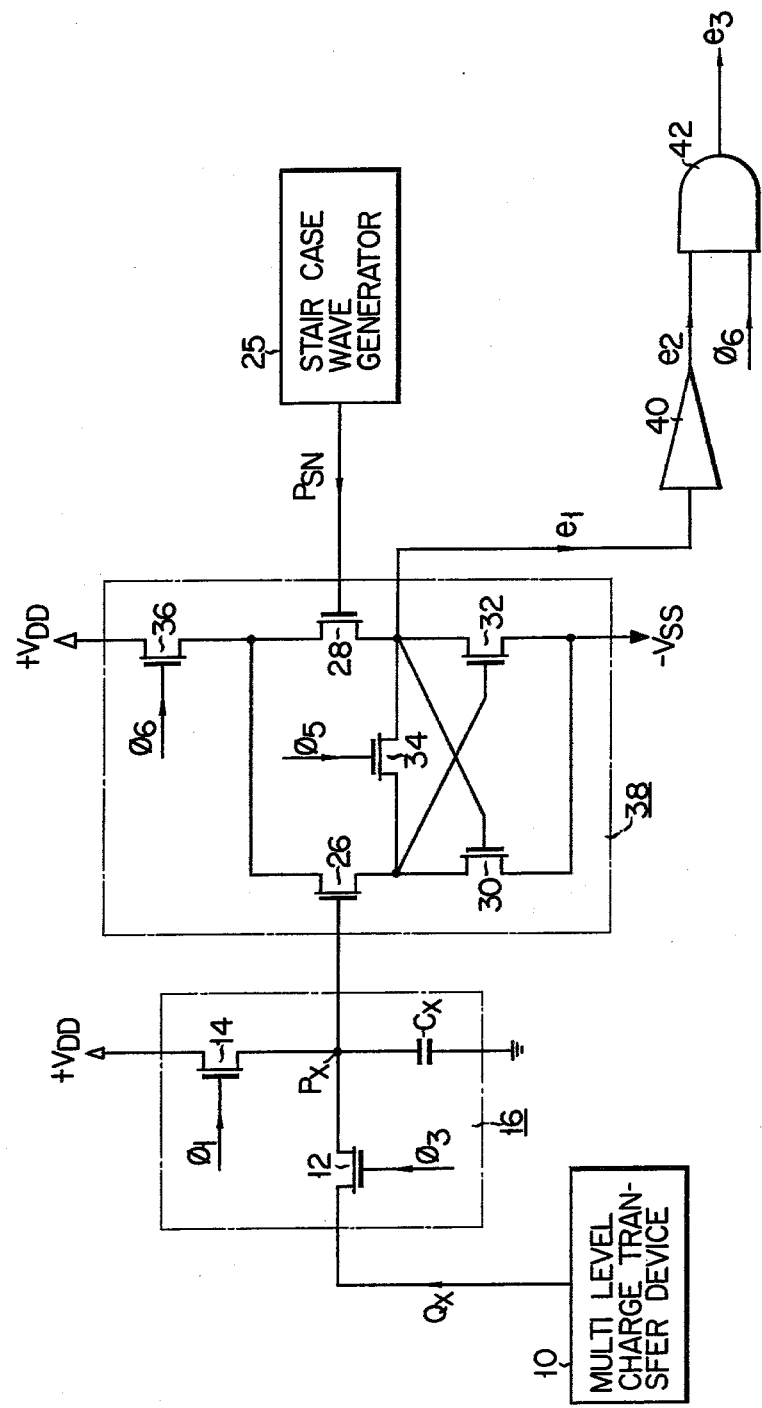
FIG. 5 is a schematic representation of another embodiment of the sensing circuit according to the invention.
Figure 6:
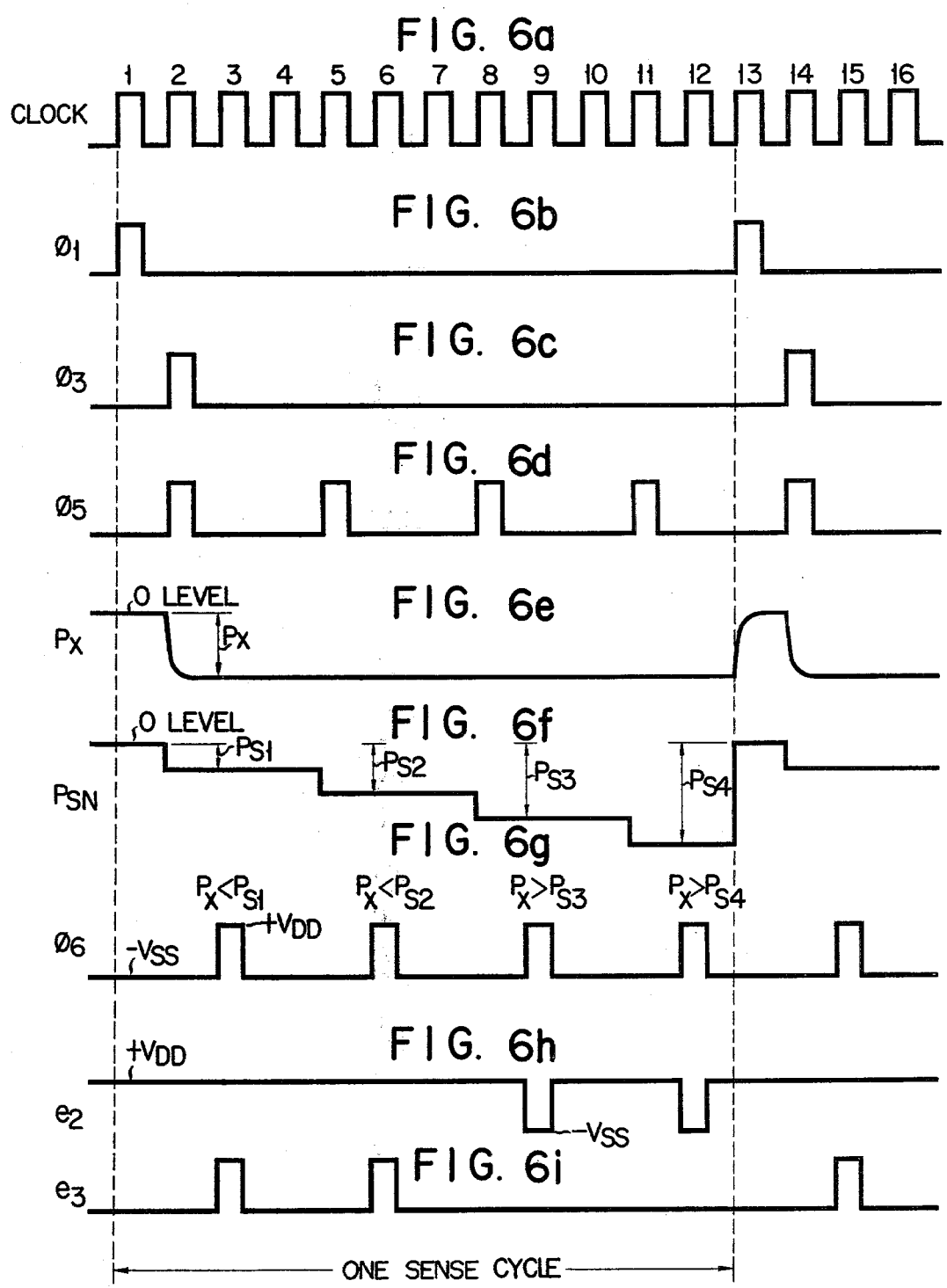
FIGS. 6a to 6i collectively represent a timing chart illustrating the operation of the circuit shown in FIG. 5.

FIG. 5 shows another embodiment of the sensing circuit. In this embodiment, a staircase wave generator 25 performs the function of the reference potential supplying circuit 24 of FIG. 3. When this generator 25 provides a four-step staircase wave as the reference potential $P_{SN}$, five levels can be sensed as the inspected charge level.

FIGS. 6a to 6i represent a timing chart illustrating the operation of the sensing circuit shown in FIG. 5. It will be seen from the comparison of the chart of FIGS. 4a to 4j and that of FIGS. 6a to 6i that the operation of the sensing circuit of FIG. 5 for sensing the N levels is practically the same as that of the circuit of FIG. 3.

Figure 7:
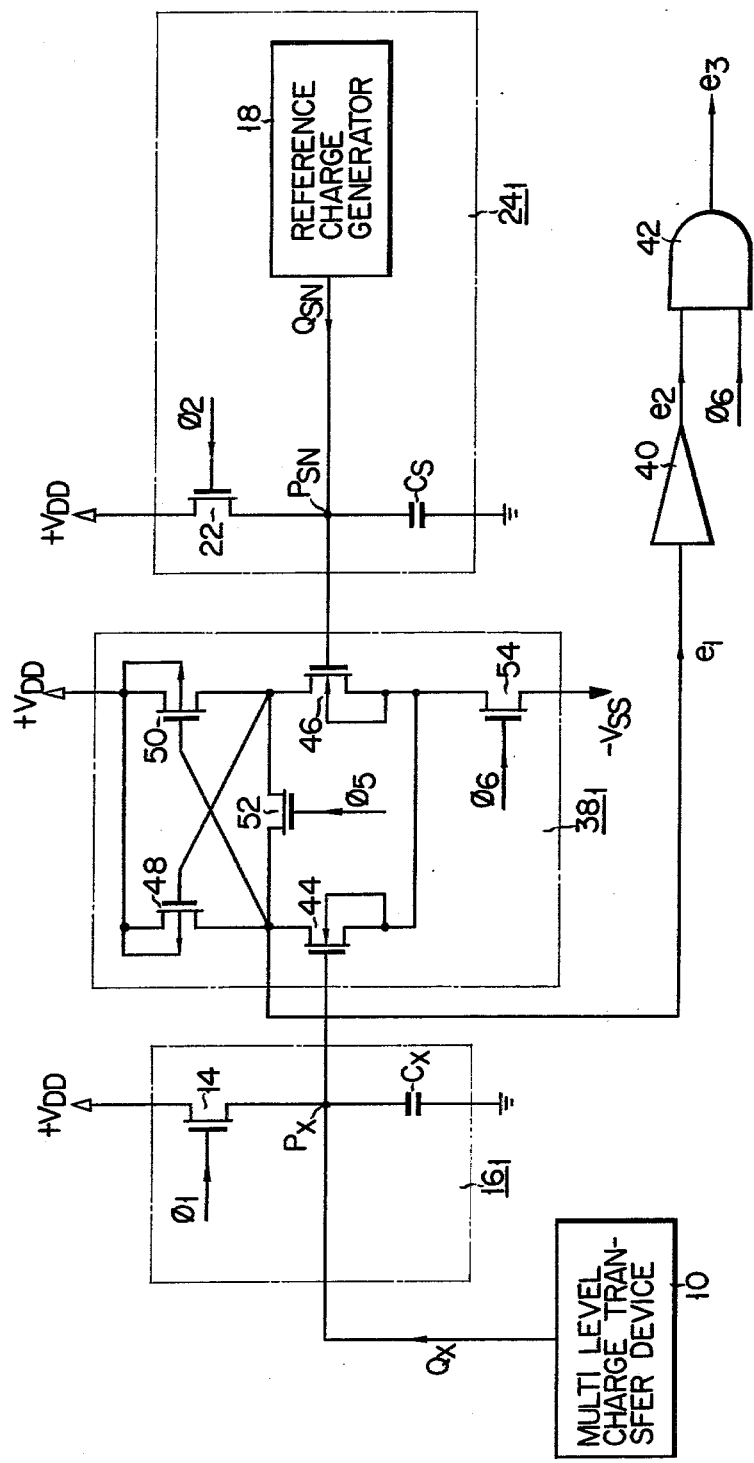
FIGS. 7 and 8 are schematic representations of further embodiments of the sensing circuit according to the invention.

FIG. 7 shows a further embodiment of the sensing circuit. In this embodiment, a flip-flop circuit including a differential amplifier circuit making use of a C-MOS (complementary symmetry metal oxide semiconductor) device is adopted as the comparator circuit 38. Here, a first transistor or an N-channel MOS FET 44 with the gate thereof used as the level sensing node, has its drain connected to the drain of a third transistor or a P-channel MOS FET 48. Also, a second transistor or an N-channel MOS FET with the gate thereof used as the reference node, has its drain connected to the drain of a fourth transistor or a P-channel MOS FET 50. The FETs 48 and 50 have their gates connected to the drains of the respective FETs 50 and 48 and their sources commonly connected to a circuit having a positive potential $+V_{DD}$. A fifth transistor or an N-channel (or P-channel) MOS FET 52 has its drain and source connected between the drain of the FETs 48 and 50. The FETs 44 and 46 have their sources connected to the drain of a sixth transistor or an N-channel MOS FET 54. The FET 54 has its source connected to a circuit having a negative potential $-V_{SS}$. The substrate of each of the FETs 44 to 50 is connected to the source of its own. The third reset signal $\phi_5$ and the third gate signal $\phi_6$ are supplied to the gates of the respective FETs 52 and 54.

In the comparator circuit $38_1$ shown in FIG. 7 the FETs 44 and 46 have an amplifying function, so that this comparator circuit is sensitive to the potential difference between the level sense node and the reference node. If it is intended to employ a very large number of levels N, to which the inspected charge level $Q_x$ can correspond, the difference between the potential $P_{xn}$ for N=n and the potential $P_{X(n+1)}$ for N=n+1 is reduced. Thus, while high sensitivity is required for the comparator circuit in order to sense a large number of N levels, the comparator circuit $38_1$ shown in FIG. 7 can meet this demand. Even with the comparator circuit 38 as shown in FIG. 3, high sensitivity, although not so high as in case of the comparator circuit $38_1$, can be obtained by appropriately selecting the operating point of the flip-flop circuit constituted by the FETs 30 and 32. However, the comparator circuit 38 is stable in operation compared to the comparator circuit $38_1$ to the extent that the former has a lower sensitivity than the latter, the former, that is, the comparator circuit 38 in FIG. 3, is rather preferred in cases where the preset N number (level) is not so large. In the case of FIG. 7, first and second gate transistors equivalent to transistors 12 and 20 of FIG. 3 are omitted. on the assumption that the aforementioned counter-flow of charge does not occur.

Figure 8:
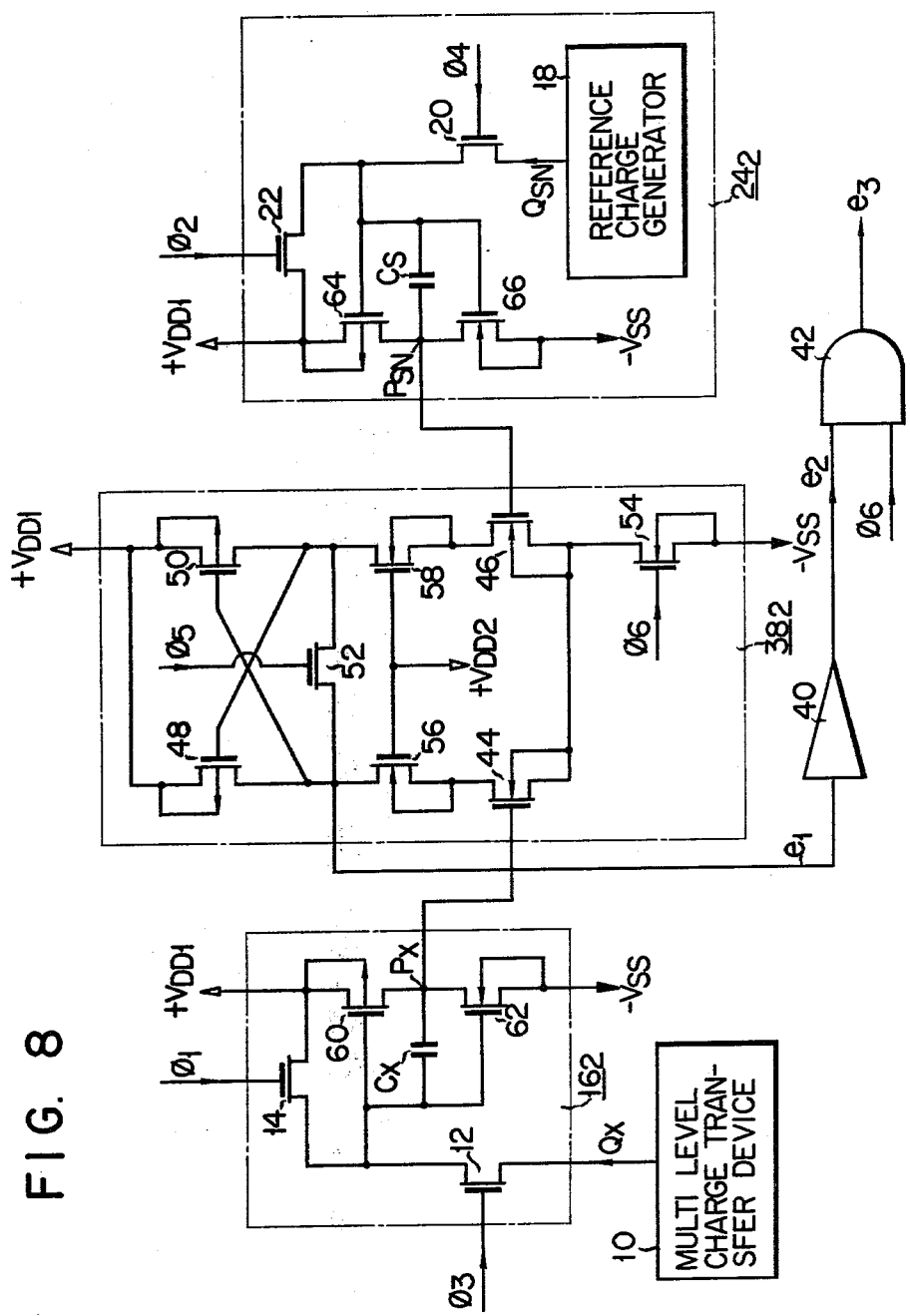

FIG. 8 shows a further embodiment of the sensing circuit. In this embodiment, a C-MOS device similar to the comparator circuit $38_1$ in FIG. 7 is utilized as the comparator circuit $38_2$. The difference of the comparator circuit $38_2$ from the comparator circuit $38_1$ is the presence of a seventh transistor or an N-channel MOS FET 56, and an eighth transistor or an N-channel MOS FET 58. The source and substrate of the FET 56 are connected to the drain of the FET 44, and the drain of the FET 56 is connected to the drain of the FET 48. The source and substrate of the FET 58 are connected to the drain of the FET 46, and the drain of the FET 58 is connected to the drain of the FET 50. The gates of the FETs 56 and 58 are commonly connected to a circuit having a positive potential $+V_{+DD2}$. This positive potential $+V_{DD2}$ is selected to be lower than the second potential $+V_{DD1}$ coupled to the flip-flop circuit consisting of the FETs 48 and 50; for example it is selected as $V_{DD2} \simeq (\frac{1}{2})V_{DD1}$.

FETs 56 and 58 are provided for the reasons explained below. Between the gate and drain of the FETs 44 and 46 parasitic capacitance is necessarily present from the standpoint of the semiconductor structure. Therefore, the pulse that is produced with the operation of the flip-flop circuit consisting of the FETs 48 and 50 gives a slight change to the gate potential on the FETs 44 and 46 through the parasitic capacitance. Namely, at this point of time, the potentials $P_x$ and $P_{SN}$ which are held by the capacitors $C_x$ and $C_s$ are slightly changed with the operation of the flip-flop circuit. Such undesired potential changes cannot be ignored in cases where a lare number N levels is employed. With the provision of the FETs 56 and 58, however, the drain potential of the FETs 44 and 46 is hardly changed even when the flip-flop circuit is operated. Thus, the possibility of generation of an undesired potential change at the level sense node and also at the reference node is practically eliminated. Although not shown in the figure, the FETs 56 and 58 may also be applied to the comparator circuit 38 in FIG. 3 as well.

Further, in this embodiment a Miller integrator circuit is utilized for both inspected charge hold circuit $16_2$ and reference potential supplying circuit $24_2$. In the inspected charge hold circuit $16_2$, a P-channel MOS FET 60 and an N-channel MOS FET 62 have their gates connected to the junction between the FETs 12 and 14. The source and substrate of the FET 60 are connected to a circuit having a positive potential $+V_{DD1}$, and the source and substrate of the FET 62 are connected to a circuit having a negative potential $-V_{SS}$. The FETs 60 and 62 have their drains connected to each other, and a first hold capacitor $C_x$ is connected between the gates and drains of the FETs 60 and 62. The reference potential supplying circuit $24_2$ has a similar circuit construction to that of the inspected charge hold circuit $16_2$. The level sense node and reference node of the comparator circuit $38_2$ are connected to the drains of the FETs 60 and 62 and also to the drains of the FETs 64 and 66 respectively.

In the inspected charge hold circuit $16_2$, the first hold capacitor $C_x$ provides an equivalent capacitance of the magnitude corresponding to $A \cdot C_x$ where A is the amplification degree of a phase-inverted amplifier consisting of the FETs 60 and 62. For example, by setting A=100, even if $C_x$ is a small capacitance of the order of 10 pF, it means that a large capacitance of 1000 pF is equivalently used. The same thing applies to the reference charge supplying circuit $24_2$. It will be appreciated that by utilizing the Miller integrator circuit as shown in FIG. 8 the capacitances of the first and second hold capacitors $C_x$ and $C_s$ can be made extremely small, thus facilitating the integration of the capacitors $C_x$ and $C_s$ into a semiconductor integrated circuit.

Figure 9:
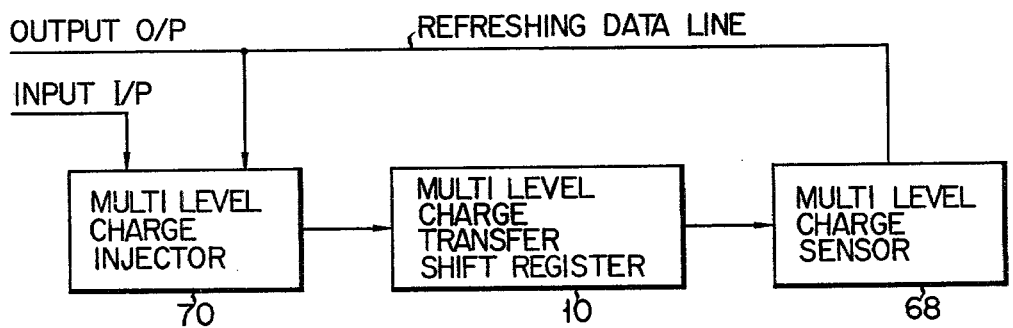
FIG. 9 is a block diagram showing a recirculating shift register using the sensing circuit according to the invention.

FIG. 9 shows a recirculating shift register constructed by employing the sensing circuit according to the invention. Data produced by a multi-level charge sensor 68 on a time-sequential basis are outputted as output pulse O/P and also fed back to a multi-level charge injector 70 through a single refreshing data line. This injector 70 receives input pulse I/P for circulating memorization as its input signal, and it supplies injection charge to a multi-level charge transfer shift register 10. The sensor 68 includes the aforementioned inspected charge hold circuit 16, reference potential supplying circuit 24, and comparator circuit 38 and senses the level of charge transferred to it by the shift register 10. The result of sensing is applied to the refreshing data line as the aforementioned data.

Figure 10:
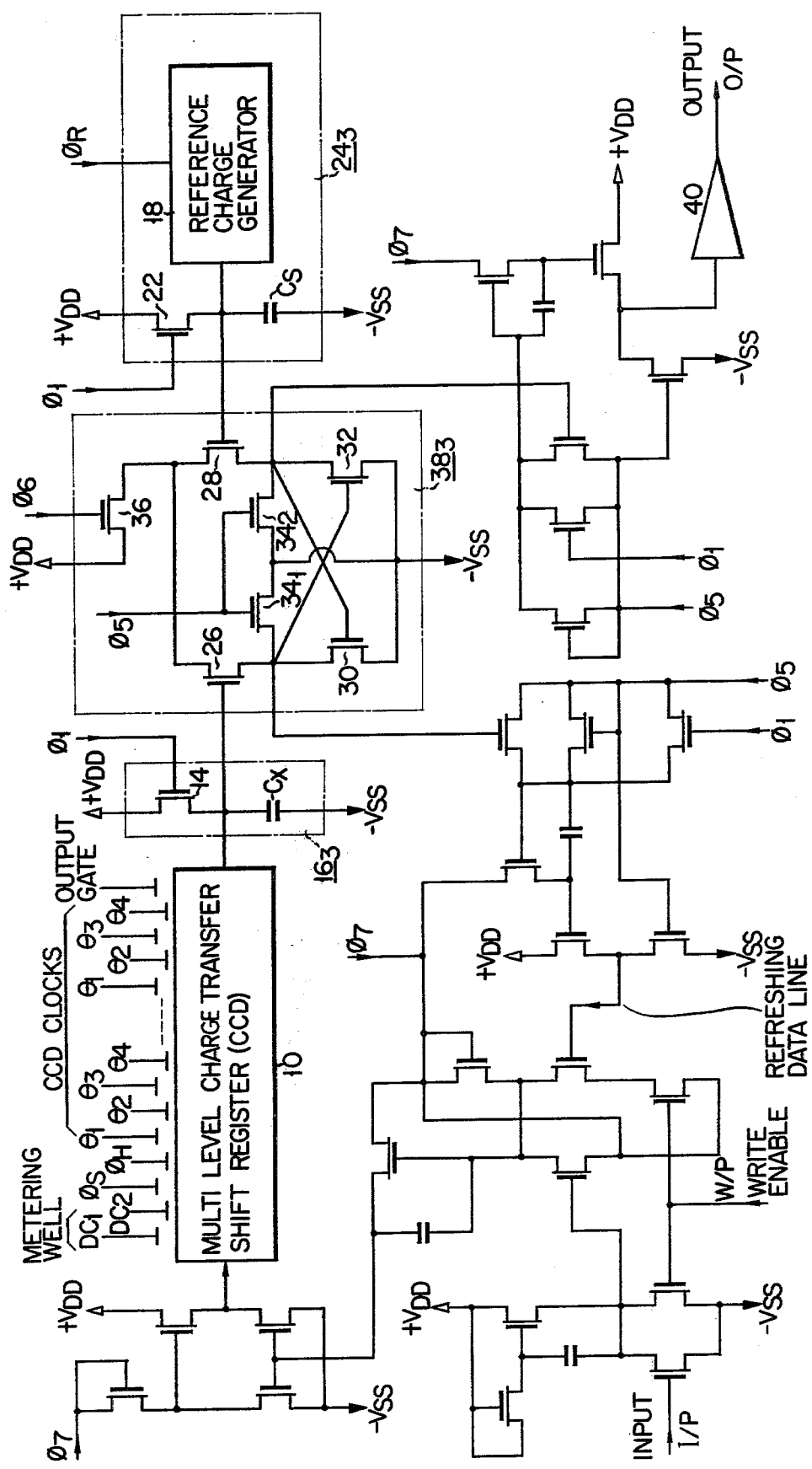
FIG. 10 is a schematic representation of a specific example of the circuit shown in FIG. 9.

FIG. 10 shows a specific example of the circuit construction of FIG. 9. In FIG. 10, a four-phase clock CCD is used as the shift register 10. Also, two MOS FETs $34_1$ and $34_2$ connected in series are used as transistors for making uniform the source potentials of the FETs 26 and 28 within the comparator circuit $38_3$ before each comparison operation. These FETs $34_1$ and $34_2$ connected to each other have their sources (or drains) connected to a negative potential source $-V_{SS}$. In the comparator circuit $38_3$, with impression of the third reset signal $\phi_5$ upon the gates of the FETs $34_1$ and $34_2$ the gate potentials of the FETs 30 and 32 are both switched to the negative potential $-V_{SS}$. In the case of FIG. 10, it is possible to give the input data also by a write enable pulse W/P independently of the input pulse I/P.

FIGS. 11a to 11m represent a timing chart illustrating the operation of the circuit of FIG. 10 for one cycle with four N-levels provided. In FIGS. 11a to 11m, a pulse signal $\phi_7$ serves to specify the circulation timing, and pulse signals $\phi_1$ to $\phi_3$ specify the charge transfer timing within the CCD. A hold pulse signal $\phi_H$ and a sample pulse signal $\phi_S$ specify the timing of charge injection into the CCD 10, and a reference pulse signal $\phi_R$ specifies the timing of supplying reference charge to the comparator circuit 38.

Figure 12:
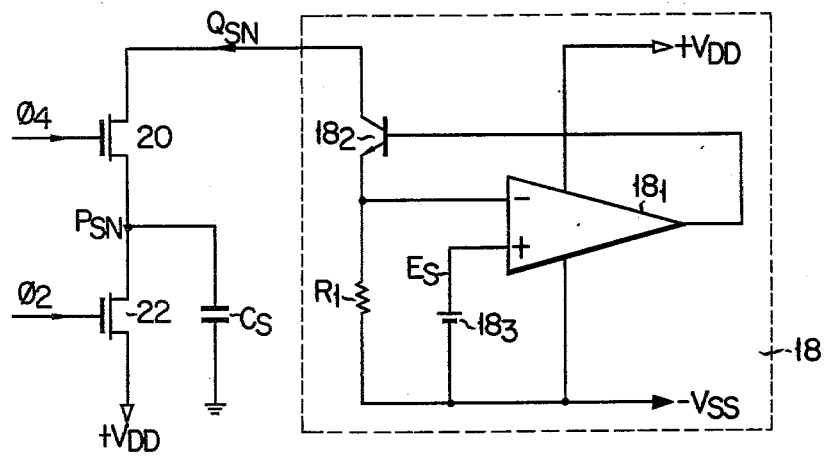
FIGS. 12 and 13 are schematic representations of circuits employing a current source as the reference charge generator.
Figure 13:
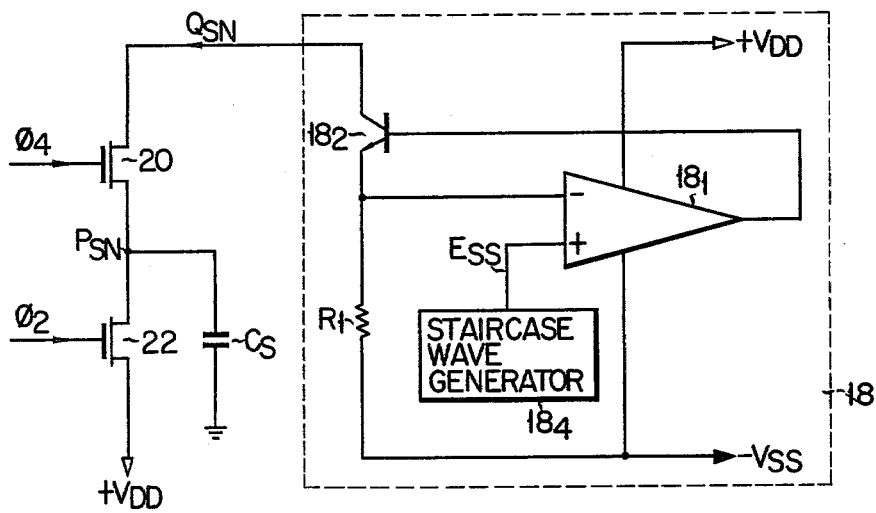

FIGS. 12 and 13 show examples of using a current source as the reference charge generator 18. FIG. 12 shows the case of a constant current source used as the reference charge generator 18, and FIG. 13 shows the case of a staircase current source which provides current varying in magnitude for each operation of comparison.

Generally, when dealing with multi-level signal charge of N level (N≦2), (N−1) comparison operations are made each time the multi-level signal charge $Q_x$ is injected. This means that the comparison operation and supply of the reference charge $Q_{SN}$ are made at a frequency of (N−1)$f_c$ where $f_c$ is the signal charge transfer frequency and reset frequency of the hold capacitors $C_x$ and $C_s$. As with the multi-level signal charge transfer device 10 mentioned above, CCD and BBD circuits can be suitably used. As this type of CCD may be used a surface channel, bulk channel and the like. Further, a block consisting of a plurality of CTDs arranged in an array can be used as the shift register. The array structure in this case may be serial-parallel-serial (SPS) structure, serpentine structure, multiplexed electrode per bit (ME/B) structure and modifications of these structures. All of such CTD arrays may be used as the aforementioned transfer device 10.

Although specific constructions have been illustrated and described herein, it is not intended that the invention be limited to the specific elements and the circuit arrangements disclosed. One skilled in the art will recognize that the particular elements or sub-circuits may be used in different variations without departing from the scope and spirit of the invention.

What is claimed is:

1. A sensing circuit for a multi-level signal charge, comprising:
    means for holding an inspected charge;
    means for providing a plurality of reference voltage potentials in sequential orders of magnitude on a time-sequential basis; and
    means for comparing an unknown voltage potential corresponding to the inspected charge level present at said inspected charge holding means with each of said plurality of reference voltage potentials, thereby to provide, upon inversion of the relation between magnitudes of the unknown voltage potential and each of the reference voltage potential being compared, a signal based upon the inversion.

2. A sensing circuit according to claim 1, wherein said inspected charge holding means includes:
    a first hold capacitor for holding the inspected charge provided thereto, said first hold capacitor having one end connected to a circuit holding a potential other than a reset voltage potential and the other end providing the unknown voltage potential; and
    a first reset transistor controlled for on-off operation by a first reset signal having a frequency corresponding to the product of the frequency of provision of each reference voltage potential from said reference voltage potential providing means and the number of the reference voltage potentials, said first reset signal being produced at a timing earlier than the instant of provision of the first reference voltage potential in one sensing cycle, said first reset transistor being connected between the other end of said hold capacitor and said circuit having the reset voltage potential.

3. A sensing circuit according to claim 2, wherein said first hold capacitor comprises a Miller integrator, said inspected charge being provided to an input terminal of said Miller integrator, said unknown voltage potential being produced at an output terminal of said Miller integrator.

4. A sensing circuit according to claim 2, including a first gate transistor controlled for on-off operation by a first gate signal produced at the same timing as the frequency of provision of said reference voltage potentials and having the same frequency as said first reset signal, said first gate transistor being connected in series with a path through which said inspected charge is supplied to said first hold capacitor.

5. A sensing circuit according to claim 1, wherein said reference voltage potential providing means includes:
    a reference charge generator for providing a reference charge;
    a first hold capacitor for holding the reference charge provided thereto from said reference charge generator, said first hold capacitor having one end connected to a circuit having a potential other than a reset voltage potential and the other end providing the reference voltage potential; and
    a first reset transistor controlled for an on-off operation by a first reset signal having a frequency corresponding to the product of the frequency of provision of each reference voltage potential from said reference voltage potential providing means and the number of the reference voltage potentials, said first reset signal being produced at a timing earlier than the instant of provision of the first reference charge in one sense cycle, said first reset transistor being connected between the other end of said first hold capacitor and said circuit having the reset voltage potential.

6. A sensing circuit according to claim 5, wherein said reference charge generator includes a charge transfer device for supplying said reference charge.

7. A sensing circuit according to claim 5, wherein said first hold capacitor comprises a Miller integrator, said reference charge being provided to an input terminal of said Miller integrator, said reference voltage potential being produced at an output terminal of said Miller integrator.

8. A sensing circuit according to claim 5, which includes a first gate transistor controlled for on-off operation by a first gate signal produced at the same timing as the frequency of provision of said reference voltage potentials and having the same frequency as the frequency of provision of said reference voltage potentials, said first gate transistor being connected in series with and between said reference charge generator and said first hold capacitor.

9. A sensing circuit according to claim 8, wherein said reference charge generator comprises a constant current source.

10. A sensing circuit according to claim 5, wherein said reference charge generator comprises a staircase current source.

11. A sensing circuit according to claim 1, wherein said comparing means includes:

a first transistor of a first conductivity type, said unknown voltage potential being applied to the gate electrode of said first transistor;

a second transistor of said first conductivity type, said reference voltage potential being applied to the gate electrode of said second transistor, the drain electrode of said second transistor being connected to the drain electrode of said first transistor;

a third transistor of said first conductivity type having its drain electrode connected to the source electrode of said first transistor, its gate electrode connected to the source electrode of said second transistor, and its source electrode connected to a circuit having a first voltage potential;

a fourth transistor of said first conductivity type having its drain electrode connected to the source electrode of said second transistor, its gate electrode connected to the source electrode of said first transistor and its source electrode connected to the source electrode of said third transistor;

a fifth transistor controlled for on-off operation by a first reset signal provided at the same timing as the frequency of provision of each of the reference voltage potentials by said reference voltage potential providing means, said fifth transistor being connected between the gate electrodes of said third and fourth transistors for reducing the potential difference between the gate electrode of said third and fourth transistors substantially to zero before said comparing means performs said comparing operation; and a sixth transistor controlled for on-off operation by a first gate signal having the same frequency as that of said first reset signal and produced at a timing lagging with respect to said first reset signal for a period shorter than the period of said first reset signal, said sixth transistor being connected between the drain electrodes of said first and second transistors and a circuit having a second voltage potential for controlling the comparing operation by said first gate signal.

12. A sensing circuit according to claim 11, which further comprises an AND gate circuit responsive to the signal produced at the source electrode of said second transistor and said first gate signal for providing a digital output signal corresponding to the level of said inspected charge.

13. A sensing circuit according to claim 1, wherein said reference voltage potential providing means includes a staircase wave generator for providing, as the reference voltage potentials, a potential varying with the level thereof varying stepwise in synchronizm to the timing of the comparison of the unknown voltage potential and each of said reference voltage potentials.

14. A sensing circuit according to claim 1, wherein said comparing means includes:

a first transistor of a first conductivity type, said unknown voltage potential being applied to the gate electrode of said first transistor;

a second transistor of said first conductivity type, said reference voltage potential being applied to the gate electrode of said second transistor, the source electrode of said second transistor being connected to the source electrode of said first transistor;

a third transistor of a second conductivity type having its drain electrode connected to the drain electrode of said first transistor, its gate electrode connected to the drain electrode of said second transistor, and its source electrode connected to a circuit having a second voltage potential;

a fourth transistor of said second conductivity type having its drain electrode connected to the drain electrode of said second transistor, its gate electrode connected to the drain electrode of said first transistor, and its source electrode connected to the source electrode of said third transistor;

a fifth transistor controlled for on-off operation by a first reset signal provided at the same timing as the frequency of the provision of each of the reference voltage potentials by said reference voltage potential providing means, said fifth transistor being connected between the gate electrodes of said third and fourth transistors for reducing the potential difference between the gate electrodes of said third and fourth transistors substantially to zero before said comparing means performs said comparing operation; and a sixth transistor controlled for on-off operation by a first gate signal having the same frequency as that of said first reset signal and produced at a timing lagging with respect to said first reset signal for a period shorter than the period of said first reset signal, said sixth transistor being connected between the source electrodes of said first and second transistors and a circuit having a first voltage potential for controlling the comparing operation by said first gate signal.

15. A sensing circuit according to claim 1, wherein said comparing means includes:

a first transistor of a first conductivity type, said unknown voltage potential being applied to the gate electrode of said first transistor;

a second transistor of said first conductivity type, said reference voltage potential being applied to the gate electrode of said second transistor, the source electrode of said second transistor being connected to the source electrode of said first transistor;

a seventh transistor of said first conductivity type having its source electrode connected to the drain electrode of said first transistor and its gate electrode connected to a circuit having a third voltage potential;

an eighth transistor of said first conductivity type having its source electrode connected to the drain electrode of said second transistor and its gate electrode connected to the gate electrode of said seventh transistor;

a third transistor of a second conductivity type having its drain electrode connected to the drain electrode of said seventh transistor, its gate electrode connected to the drain electrode of said eighth transistor and its source electrode connected to a circuit having a second voltage potential which is higher than the third voltage potential;

a fourth transistor of said second conductivity type having its drain electrode connected to the drain electrode of said eighth transistor, its gate electrode connected to the drain electrode of said seventh transistor and its source electrode connected to the source electrode of said third transistor;

a fifth transistor on-off controlled for on-off operation by a first reset signal provided at the same timing as the frequency of provision of each of the reference voltage potentials by said reference voltage potential providing means, said fifth transistor being connected between the gate electrodes of said third and fourth transistors for reducing the potential difference between the gate electrodes of said third and fourth transistors substantially to zero before said comparing means performs said comparing operation; and a sixth transistor controlled for on-off operation by a first gate signal having the same frequency as said first reset signal and provided at a timing lagging with respect to said first reset signal for a period shorter than the period of said first reset signal, said sixth transistor being connected between the source electrodes of said first and second transistors and a circuit having a first voltage potential for controlling the comparing operation by said first gate signal.

16. A sensing circuit according to claim 1, wherein said comparing means includes:

a first transistor of a first conductivity type, said unknown voltage potential being applied to the gate potential of said first transistor;

a second transistor of said first conductivity type, said reference voltage potential being applied to the gate electrode of said second transistor, the drain electrode of said second transistor being connected to the drain electrode of said first transistor;

a third transistor of said first conductivity type having its drain electrode connected to the source electrode of said first transistor, its gate electrode connected to the source electrode of said second transistor and its source electrode connected to a circuit having a first voltage potential;

a fourth transistor of said first conductivity type having its drain electrode connected to the source electrode of said second transistor, its gate electrode connected to the source electrode of said first transistor and its source electrode connected to the source electrode of said third transistor;

two transistors controlled for on-off operation by a first reset signal provided at the same timing as the frequency of provision of each of said reference voltage potentials by said reference voltage potential providing means, each of said two transistors having its source electrode connected to said circuit having said first voltage potential, its gate electrode receiving said first reset signal given thereto and its drain electrode connected to the gate electrodes of said third and fourth transistors for reducing the potential difference between the gate electrodes of said third and fourth transistors substantially to zero before said comparing means performs said comparing operation; and a sixth transistor controlled for on-off operation by a first gate signal having the same frequency as said first reset signal and provided at a timing lagging with respect to said first reset signal for a period shorter than the period of said first reset signal, said sixth transistor being connected between the drain electrodes of said first and second transistors and a circuit having a second potential for controlling said comparing operation by said first gate signal.

17. A sensing circuit according to claim 1, wherein said comparing means includes:

a first transistor of a first conductivity type, said unknown voltage potential being applied to the gate electrode of said first transistor;

a second transistor of said first conductivity type, said reference voltage potential being applied to the gate electrode of said second transistor, the source electrode of said second transistor being connected to the source electrode of said first transistor;

a third transistor of a second conductivity type having its drain electrode connected to the drain electrode of said first transistor, its gate electrode connected to the drain electrode of said second transistor, and its source electrode connected to a circuit having a second voltage potential;

a fourth transistor of said second conductivity type having its drain electrode connected to the drain electrode of said second transistor, its gate electrode connected to the drain electrode of said first transistor, and its source electrode connected to the source electrode of said third transistor;

two transistors controlled for on-off operation by a first reset signal provided at the same timing as the frequency of provision of each of said reference voltage potentials by said reference voltage potential providing means, each of said two transistors having its source electrode connected to said circuit having said second voltage potential, its gate electrode receiving said first reset signal provided thereto and its drain electrode connected to the gate electrodes of said third and fourth transistors for reducing the potential difference between the gate electrodes of said third and fourth transistors substantially to zero before said comparing means performs said comparing operation; and a sixth transistor controlled for on-off operation by a first gate signal having the same frequency as said first reset signal and provided at a timing lagging with respect to said first reset signal for a period shorter than the period of said first reset signal, said sixth transistor being connected between the source electrodes of said first and second transistors and a circuit having a first voltage potential for controlling said comparing operation by said first gate signal.

18. A sensing circuit according to claim 1, which further comprises:

a charge transfer device for supplying a multi-level signal charge as inspected charge to said inspected charge hold means;

a multi-level charge injector for injecting said multi-level signal charge to said charge transfer device; and a single refreshing data line feeding a sensed signal provided from said comparing means back to said signal charge injector for recirculating memorization.

19. A process of sensing multi-level signal charge, comprising the steps of producing an unknown voltage potential by holding an inspected charge, comparing said unknown voltage potential with a plurality of known reference voltage potentials of varying levels generated in sequential orders of magnitude on a time-sequential basis, and sensing the level of said inspected charge in terms of the number of comparing operations carried out until the inversion of the result of the comparison takes place.

* * * * *